(12) United States Patent
Umemoto (10) Patent No.: US 6,561,782 B1
(45) Date of Patent: May 13, 2003

(54) GATE FOR MOLDING DEVICE (75) Inventor: Kazuhiro Umemoto, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 09/670,647

(22) Filed: Sep. 27, 2000

(30) Foreign Application Priority Data

Oct. 28, 1999 (JP) ............................................. 11-307026

(51) Int. Cl.⁷ ................................................ B29C 45/18
(52) U.S. Cl. ............... 425/116; 264/272.17; 425/129.1; 425/573
(58) Field of Search ................................ 425/112, 123, 425/127, 129.1, 542, 573, 588, 808, 116; 264/272.17, 328.12; 249/110, 111

(56) References Cited

U.S. PATENT DOCUMENTS

| 4,239,724 | A | * | 12/1980 | Adell | 264/328.8 |
|---|---|---|---|---|---|
| 4,252,294 | A | * | 2/1981 | Uchio | 249/105 |
| 4,554,126 | A | * | 11/1985 | Sera | 264/272.17 |
| 5,635,220 | A | * | 6/1997 | Izumi et al. | 425/116 |
| 5,723,156 | A | * | 3/1998 | Matumoto | 425/116 |
| 5,750,153 | A | * | 5/1998 | Shibata | 425/116 |
| 5,853,771 | A | * | 12/1998 | Matsumoto | 425/116 |
| 5,904,746 | A | * | 5/1999 | Okada | 65/66 |

* cited by examiner

*Primary Examiner*—Jan H. Silbaugh
*Assistant Examiner*—Emmanuel Luk
(74) *Attorney, Agent, or Firm*—William N. Hogg (57) ABSTRACT

A molding device and method utilizes a cavity including first and second parts for molding an article having one or more convex portions and a gate for injecting mold resin into the cavity. The gate in turn includes one or more gate sides for injecting resin into a concave portion of one part and a gate base for injecting resin into a second of the parts in which no concave portions are located, both resin injections occurring simultaneously and substantially encapsulating a semiconductor element to form a molded article having a convex lens.

8 Claims, 10 Drawing Sheets

GATE FOR MOLDING DEVICE

FIELD OF THE INVENTION

The present invention relates to a molding device and a molding method. More particularly, it relates to a molding device and a molding method for producing an optical semiconductor device, e.g., one used for an IrDA (Infrared Data Association) module.

BACKGROUND OF THE INVENTION

Optical semiconductor devices for transmitting or receiving infrared rays have been used for digital assistant and notebook-sized personal computer-equipped IrDA modules which are used to carry out radio (infrared rays) data communication. Such optical semiconductor devices include lens parts, and are molded with mold resins and then packaged to be used. To mold these optical semiconductor devices, molding devices which are capable of obtaining molded articles with high dimension accuracy have been used. These molding devices are used to mold articles by injecting mold resins from gates into cavities formed by the molds. Since the gates of the molding devices control flow rates of mold resins flowing into the cavities and the filling status within the cavities, whether or not molding articles are successful depends to a large degree on the shape of the gates and their positions.

Particularly, if the shape and the position of the gate of the molding device is not appropriate for the respective cavity, bubbles or voids may be caused in the mold resin when the mold resin is injected. Should such bubbles or voids remain in the finished package, especially in a lens part, optical characteristics for transmitting and receiving infrared rays emitted from an optical semiconductor device may be adversely affected. Further, the occurrence of a weld line (junction line) may cause cracks in addition to being undesirable to the appearance of the final product. Various arrangements of the gate have been considered to remove this defect.

Figure 12:
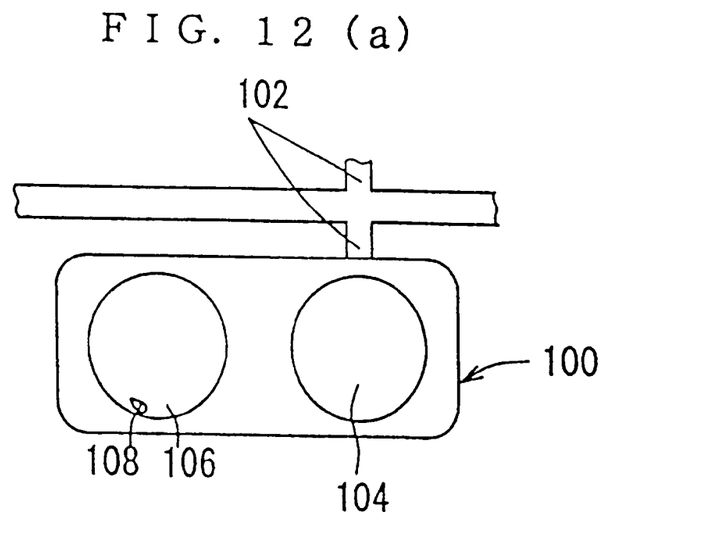

For example, FIGS. 12(a) and 12(b) show examples of a gate 102 that is provided on only one side of a cavity member 100. In such cases, a mold resin sequentially flows within member 100 without admitting air in the mold resin so that the cavity 100 can be filled with mold resin, which leads to an article free from defects. Consequently, in either case, few failures occur on a hemispherical portion 104 which is closer to the gate 102 because of the pre-injection of the mold resin into the hemispherical portion 104 which is closer to the gate 102. There has been a problem, however, that a void (voids) 108 may be formed on a hemispherical portion 106 which is further from the gate 102 due to air admitted in the mold resin caused by the flow of the mold resin.

Figure 13:
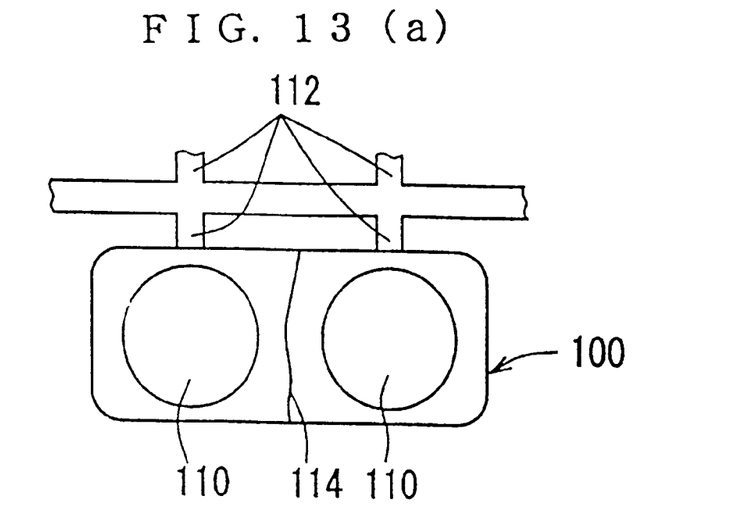

Further, FIGS. 13(a) and 13(b) show examples of gates 112 that are provided on both sides of a cavity member 100. The gates 112 are respectively arranged adjacent a pair of hemispherical portions 110. Accordingly, simultaneous injection of the mold resins into the hemispherical portions 110 can produce failure caused by voids which may occur on the hemispherical portions 110. One problem that may occur, however, when using this approach is that a weld line 114 may be formed between the pair of hemispherical portions 110 where the mold resin merged. Such a weld line might cause further cracks in addition to being undesirable in appearance.

Figure 14:
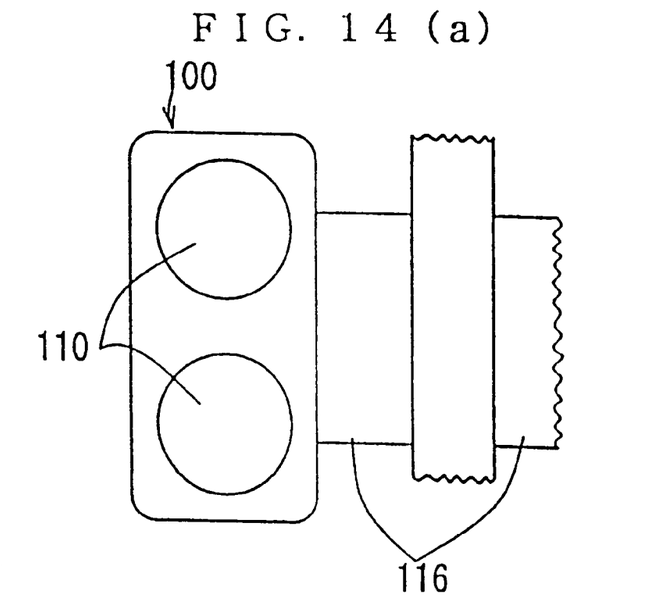
FIG. 14(a), as mentioned above, is a plan view of a main part illustrating an example of a plate-like gate provided on the cavity.
FIG. 14(b) is a cross-sectional view of the FIG. 14(a) part, illustrating an example of arranging an inwardly inclined surface of the plate-like gate.
FIG. 14(c) is a cross-sectional view illustrating a plate-like gate without inclination.

Next, as shown in FIGS. 14(a) through 14(c), there is a method that a plate-like gate 116 is disposed on a cavity member 100. For example, as the shape of a longitudinal cross section of the plate-like gate 116 is shown in FIG. 14(b), an inclination is provided on the upper surface side of the gate 116 to allow the injected mold resin (not shown) to be directed accurately to the receiving hemispherical portions 110. In this case, no failures, voids, etc. occurred on the hemispherical portions 110. However, a large void (or voids) 120 may form on a portion where the mold resin introduced from the lower side of an optical semiconductor element 118 disposed within the cavity member 100 is reversed, or form on a portion where the mold resin introduced from the lower side of the semiconductor element 118 engages the mold resin injected from the upper side of the semiconductor element 118.

Using the longitudinal cross section of the gate shown in FIG. 14(c) for injecting the mold resin directly into the cavity 100 from the plate-like gate 116 without the shown inclined inner surfaces may result in the formation of voids 122 on the upper part of the hemispherical portions 110 or on the optical semiconductor element 118. No weld lines as occurred between the hemispherical portions 110 in FIGS. 13(a) and 13(b) were observed.

OBJECT AND SUMMARY OF THE INVENTION

It is an object of the present invention to provide a molding device and a molding method which do not leave voids, weld lines or the like in a molded article, particularly when an optical semiconductor element is molded using a mold resin.

According to one aspect of the invention, there is provided a molding device comprising a cavity having first and second parts, at least one of the parts including at least one concave portion therein for molding an article having at least one convex portion therein, and a gate for injecting mold resin into the first and second parts of the cavity, the gate including at least one gate side portion for directly the mold resin into the part of the cavity having the at least one concave portion for molding a portion of the article having the at least one convex portion, and at least one plate-like gate base for injecting the mold resin in a substantially flat sheet state into the other part of the cavity for molding the other portion of the article.

According to another aspect of the invention, there is provided a method for molding an article, the method comprising the steps of providing a molding device having first and second parts defining a cavity, at least one of the parts including a concave portion, injecting mold resin into the concave portion of the at least one of the parts for molding a portion of the article including at least one convex portion, and injecting mold resin into the other of the first and second parts for molding another portion of the article having no convex portion, the injecting the mold resin into both of the first and second parts occurring substantially simultaneously.

BRIEF DESCRIPTION OF THE DRAWINGS

FIGS. 5(a) through (c) are enlarged views of another embodiment of the present invention, FIG. 5(b) being taken along the line CC in FIG. 5(a), while FIG. 5(c) is taken along the line D—D.

Both FIGS. 12(a) and (b), as discussed previously, are enlarged plan views of a main part showing voids which are caused when a gate is provided on only one side of the cavity having two hemispherical portions.

Both FIGS. 13(a) and (b), as also discussed above, are plan views of a main part showing a weld line which occurs when gates are respectively provided on both sides of the cavity having two hemispherical portions.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. to FIG.

In the drawings, the appearance of a mold for the molding device, or the like is omitted, for ease of illustration, and the shape of its cavity, gate, and runner comprising the mold, or the like is indicated.

Figure 1:
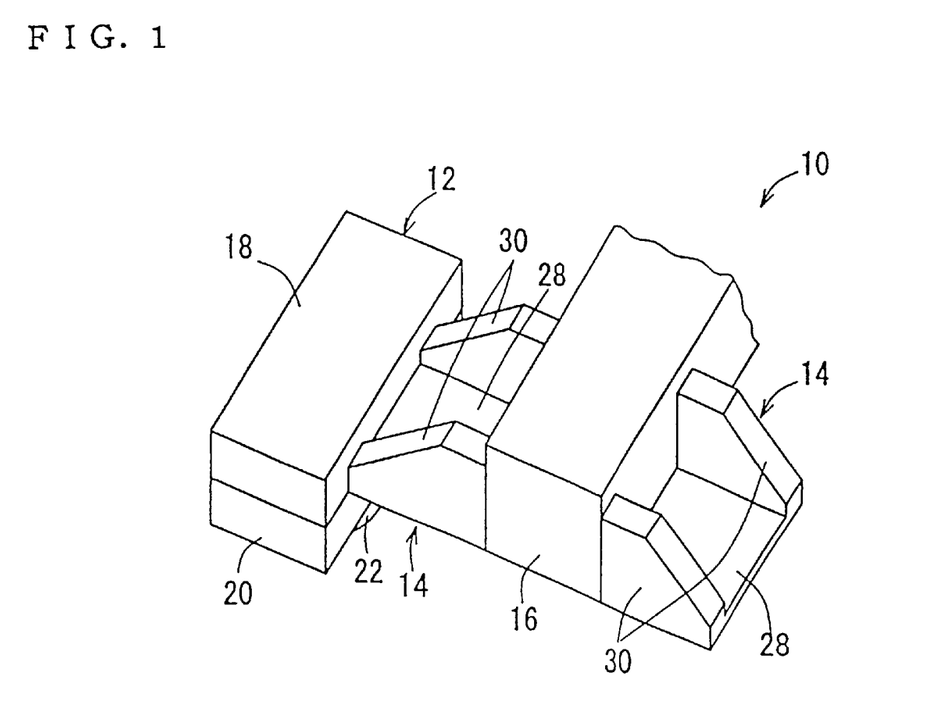
FIG. 1 is an enlarged perspective view illustrating one embodiment of a molding device according to the present invention.
Figure 2:
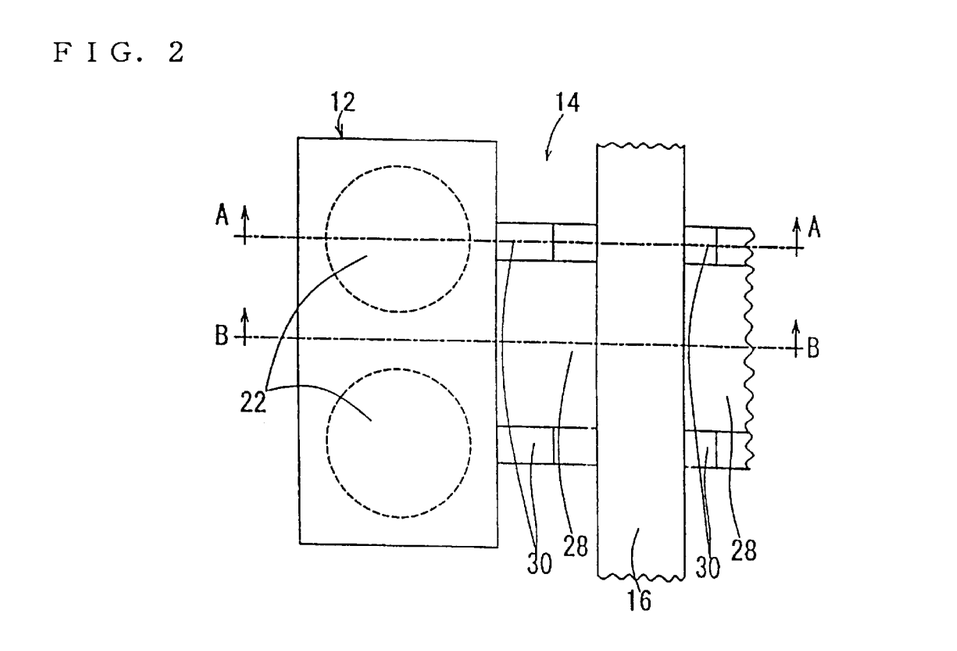
FIG. 2 is a plan view of the molding device shown in FIG. 1.
Figure 3:
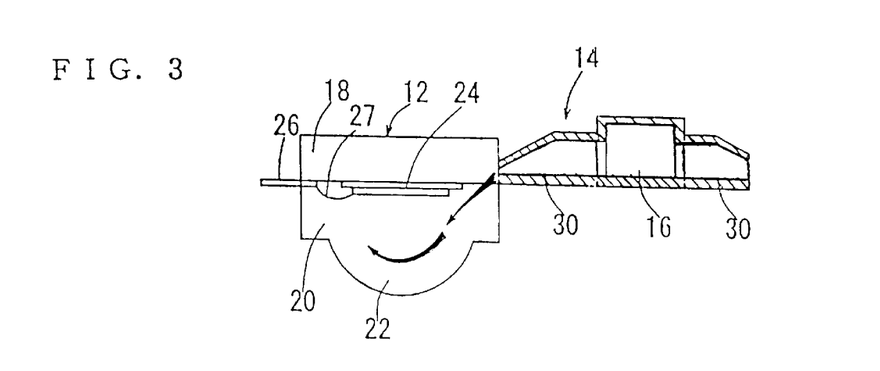
FIG. 3 is a drawing illustrating operation of the molding device shown in FIG. 1 as taken through line A—A in FIG. 2.
Figure 4:
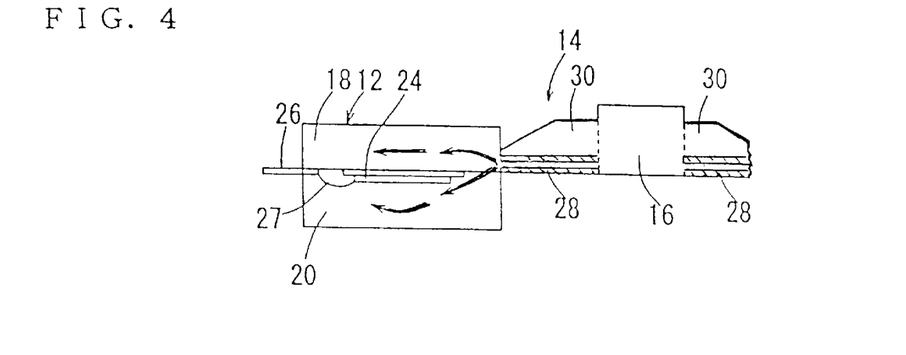
FIG. 4 is a drawing illustrating operation of the molding device shown in FIG. 1 as taken through the line B—B FIG. 2.

FIG. 1 shows a perspective view of one embodiment of a molding device of the present invention. Molding device 10 comprises a cavity 12 having upper and lower parts 18 and 20, respectively, a gate 14 for injecting a mold resin (not shown) into cavity 12, and a runner 16 for providing the mold resin to gate 14. In this embodiment, as shown in FIGS. 2, 3, and 4, upper part 18 of cavity 12 is in the shape of a rectangle, while the lower part 20 of cavity 12 includes a concave portion 22 which is preferably semi-spherical. As seen in FIG. 2, two concave portions 22 are formed beneath the rectangular upper part 18.

In FIGS. 3 and 4, an optical semiconductor element 24 is disposed between the upper and lower parts 18 and 20. The optical semiconductor element 24 is supported within cavity 12 by a plurality of lead pins 26, which, as seen in FIGS. 3 and 4, project externally from one side wall of cavity 12. A gap which is not shown in the drawings is formed between the lead pins 26 and is used for an air vent. The number 27 indicated in the drawings is a bonding wire, which, as shown, is connected to pin 26 and element 24. Bonding wires connecting such elements and leads are known and further description is not believed necessary. Examples of element 24 include a photodiode, an LED (light-emitted diode), and an integrated circuit (e.g., ASIC) for a signal transmitter/receiver.

The gate 14 for injecting the mold resin into cavity 12 is arranged on a junction between the upper cavity part 18 and the lower cavity part 20. Gate 14 comprises a plate-like base 28 and sides 30 for molding lens parts as described above. As seen in FIG. 1, gate 14 is of integral construction (both base and sides comprising an integral structure). The opening of the plate-like gate base 28 (toward the cavity 12) is slit-shaped, with the base 28 so structured that the mold resin provided cavity 12 is uniformly and rapidly charged throughout all portions of the cavity. The resin ejected from plate-like base 28 is done so in a substantially flat sheet form. In addition, the mold resin extruded from the gate base 28 while under high pressure is released from said pressure when it enters into the cavity so as to spread out (e.g., upwardly and downwardly) to fill the cavity with the mold resin so that the mold resin can fully cover the top surface(s) of the optical semiconductor element 24.

In comparison, as shown in FIG. 3, the openings of the gate sides 30 are of a substantially rectangular shape, and include an inclined inner ceiling (two shown in each gate side 30 in FIG. 1). The mold resin within the gate sides 30 flows along these inclined surfaces and is extruded toward the concave, bottom portions 22, flowing (see the arrows) along the surfaces of these portions 22, while removing any air therein. As a result, no voids and bubbles are created on portions 22. The mold resin extruded from the gate sides 30 is under high pressure upon entrance into cavity 12, causing it to spread uniformly through the lower part 20 and fully cover the bottom surface(s) of the product (e.g., element 24) being molded. This pressure is then relieved.

Filling of mold resin from gate base (see the arrows in FIG. 4) 28 is conducted simultaneously with filling of the mold resin from the gate sides 30. As a result of this unique filling process, air within the cavity 12 is rapidly expelled through a gap (opening) formed between one or more lead pins 26 sandwiched between the upper and lower parts 18 and 20, thus eliminating the possibility of air being left behind in the mold resin. Additionally, an interconnection between the gate base 28 and gate sides 30 assures that the mold resin is injected as a substantially solid mass. No weld lines, therefore, occur in the molded article. The type of mold resin to be used in this invention is determined according to the desired optical characteristics of the final product being encapsulated. For example, a resin which will pass infrared rays may be used. The invention is thus not limited to use of transparent resins.

The size of the openings (inlets) of gate sides 30 may vary, depending on the volume of the concave portions 22, the size of the parts being encapsulated, the viscosity of the resin, etc. More particularly, the rate at which the mold resin is injected into the cavity 12 from the plate-like gate base 28 and the gate sides 30, especially for lens parts, is maintained at a constant. The height of the gate sides 30 may be higher than that of base 28 to increase the flow rate. The resulting desired size of the base 28 and sides 30 for lens parts is based on the volume of upper part 18, lower part 20, and the concave portions 22. In one example, the height of the plate-like gate base 28 is within the range of about 0.04 mm to about 0.6 mm, and the corresponding height of the gate sides 30 is within the range of about 0.2 mm to about 1 mm for a ratio range of about 0.6:1 to about 5:1. Further, in this example, it is preferable that the overall width of gate 14 be within the range of about 4 to about 10 mm, with the width of one of the gate sides 30 being within the range of about 0.5 to about 2 mm. The corresponding size of the rectangular shaped part 18 of cavity 12 preferably has dimensions of about 8 to 15 mm long, about 3 to 5 mm high and about 2 to 6 mm wide. The concave, lower part 20 has a diameter of about 2 to about 5 mm.

Figure 5A:
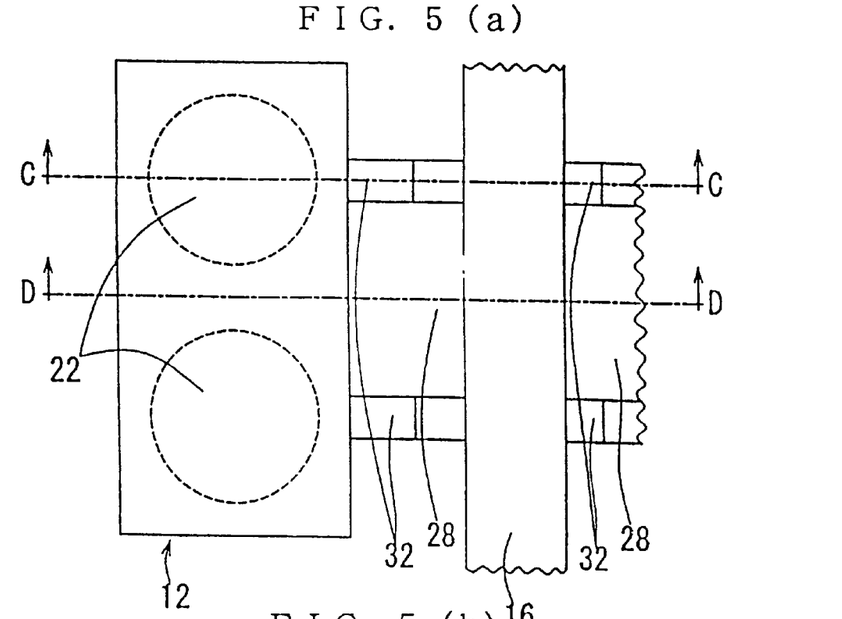
Figure 5B:
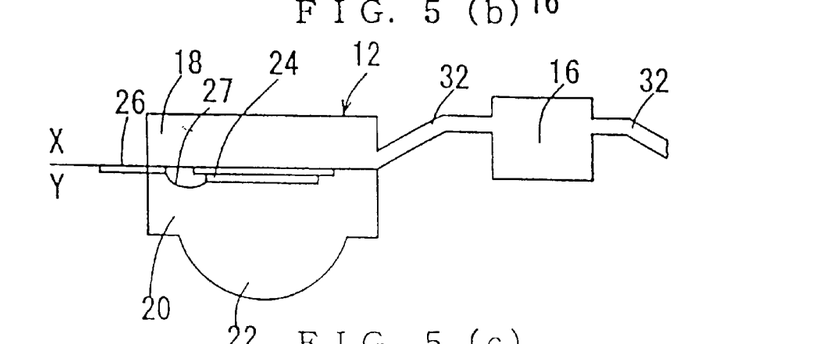
Figure 5C:
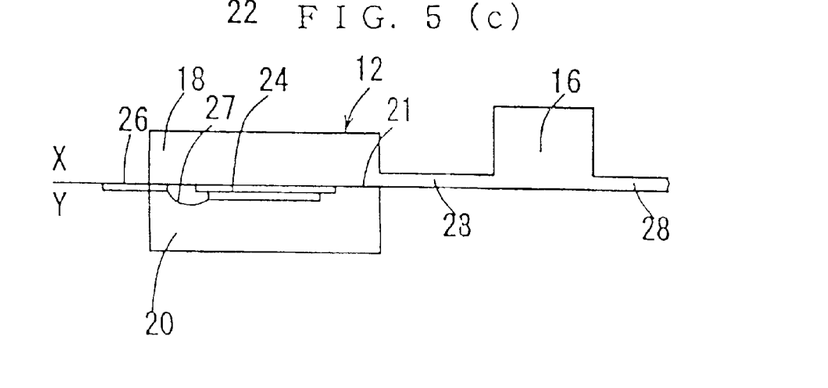

While one embodiment of the molding device and the molding method according to the present invention has been described, it is understood that the present invention is not limited to the above-mentioned embodiment. (In the following drawing FIGS., like numbers to those used in FIGS. 1–4 are used to illustrate similar, albeit perhaps not identical, parts.) For example, although an inclined plane is used for the inner, upper surface of the gate sides, other embodiments are possible. Typically, as shown in FIGS. 5(a) to 5(c), relatively straight top and bottom gate sides 32 can be used, with these sides angled downwardly so that the mold resin injected from these gate sides is directed primarily onto the concave surfaces 22 of lower part 20. Such downward injection results in the expelling of air from the lower part 20, no voids thus occurring therein. When using such gate sides 30, the plate-like gate base 28 (FIG. 5(c)) is in the same shape as in FIG. 4, and the mold resin is thus directly injected into the middle section of upper part 18. As before, the mold resin is injected into the upper and lower parts simultaneously. This results in no failures such as weld lines occurring in the product molded within the resin.

Figure 6:
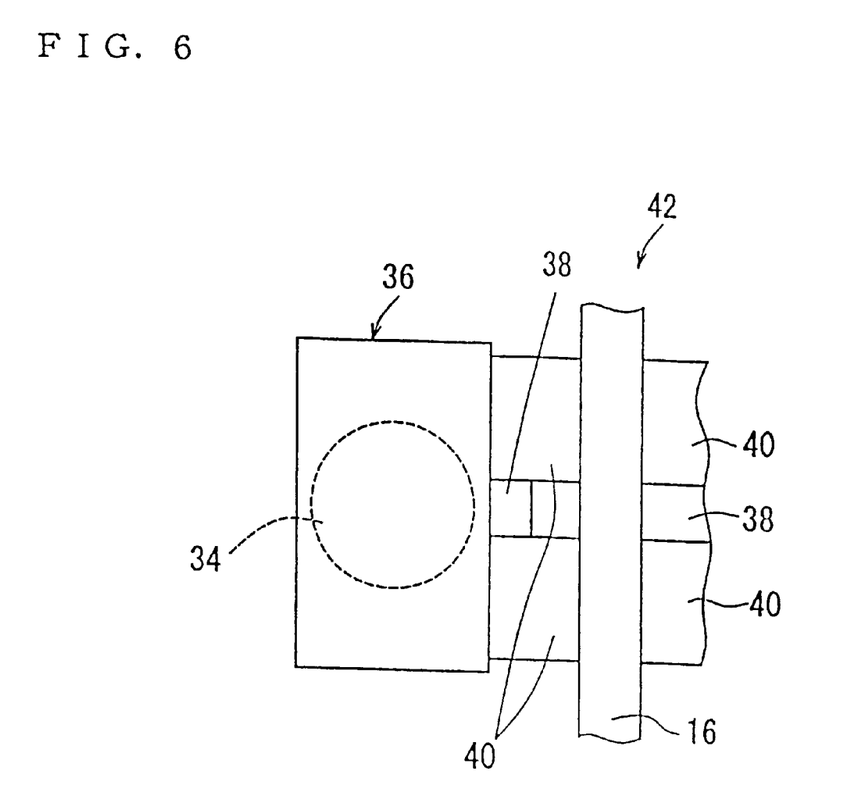
FIG. 6 is an enlarged plan view of another embodiment of the present invention.

Next, the present invention is also applicable to the molding of an optical semiconductor device equipped with a convex lens. More particularly, as shown in FIG. 6, a molding device 42 comprises a cavity 36 equipped with a semi-spherical portion 34 and a gate side 38 having plate-like gate base portions 40 on both sides. The structure of FIG. 6 is similar to that of FIG. 1 above, except that the base part is narrower and surrounded on opposite sides by much wider base portions 40. Accordingly, the mold resin injected from the plate-like gate base portions 40 is rapidly discharged into the portions of the surrounding concave portion 34 while the mold resin injected from the central base 38 is simultaneously dispensed onto concave portion 34. When using the molding device 42 in the embodiment of FIG. 6 of the present invention, the production speed for lens parts can be improved substantially over prior known molding processes without evolution of any voids or bubbles in the final product.

Figure 7:
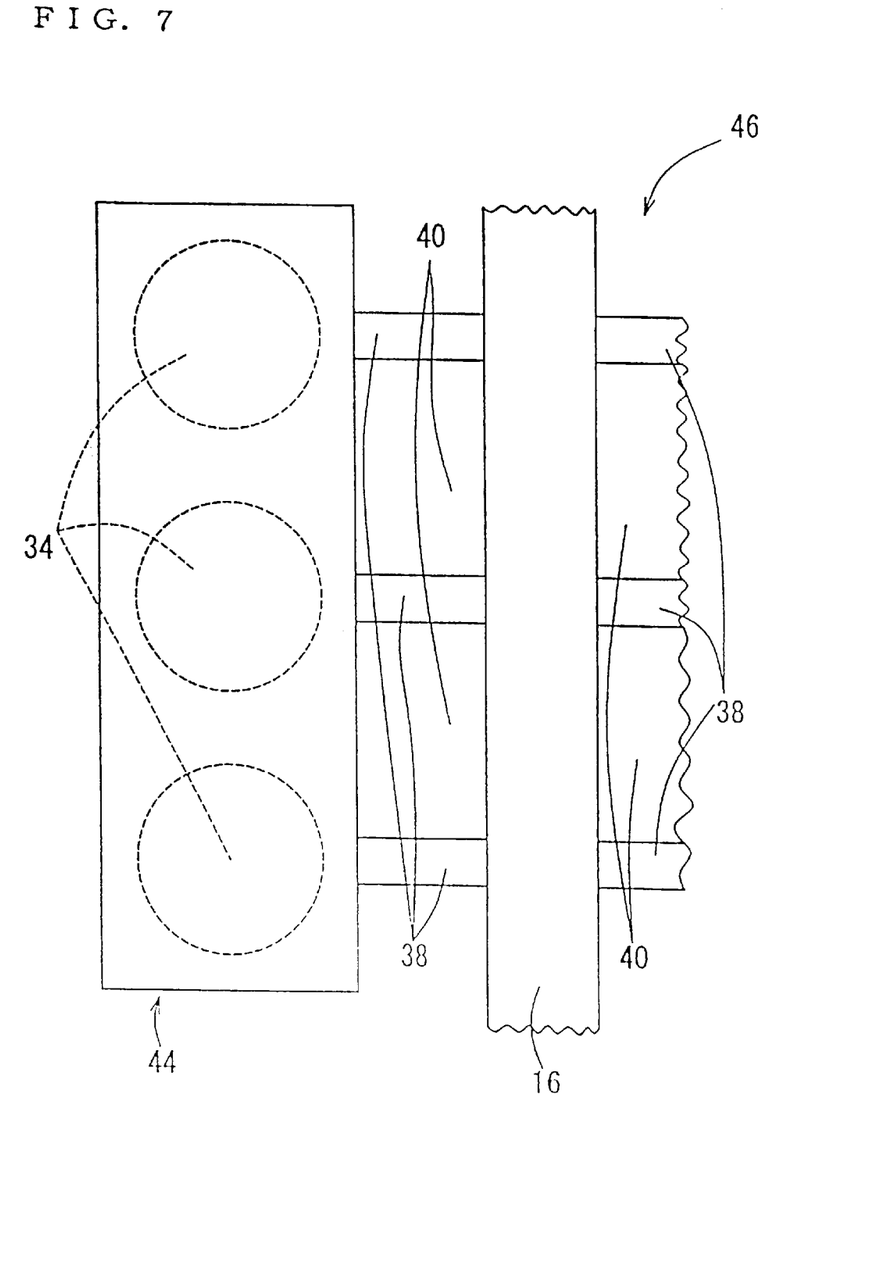
FIG. 7 is an enlarged plan view of a further embodiment of the present invention.

The present invention is also capable of molding an optical semiconductor device equipped with at least three convex lenses. For example, as shown in FIG. 7, it is also possible for a molding device 46 to include a cavity 44 equipped with three concave portions 34 on the lower part, with three gate sides 38 oriented relative to the respective concave portions 34. Also, two plate-like gate bases 40 are sandwiched between two gate bases, as shown. The shapes of the gate sides 38 and plate-like gate bases 40 are similar to those in FIG. 1 above. The mold resin injected from the gates 40 is rapidly discharged into the periphery of cavity 44 while the mold resin injected from the gate sides 38 is directed onto the concave portions 34. With this device, and simultaneous mold resin dispense, no weld lines occurred, as well as no voids or bubbles.

Figure 8:
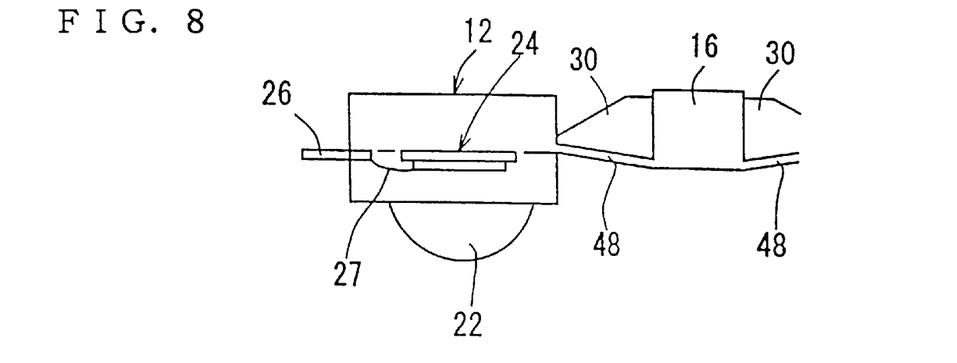
FIG. 8 is an enlarged cross-sectional view of a still further embodiment of the present invention.

Next, as shown in FIG. 8, a plate-like gate base 48 is preferably inclined slightly upwardly so that the injection direction of the mold resin injected into the cavity 12 is in a direction different from that toward the concave portions 22. Specifically, each direction forms an acute angle either upward or downward with respect to the horizontal. Altering the injection directions of the mold resin in this offsetting (from the horizontal) results in a rapid filling of the mold resin in cavity 12.

Figure 9:
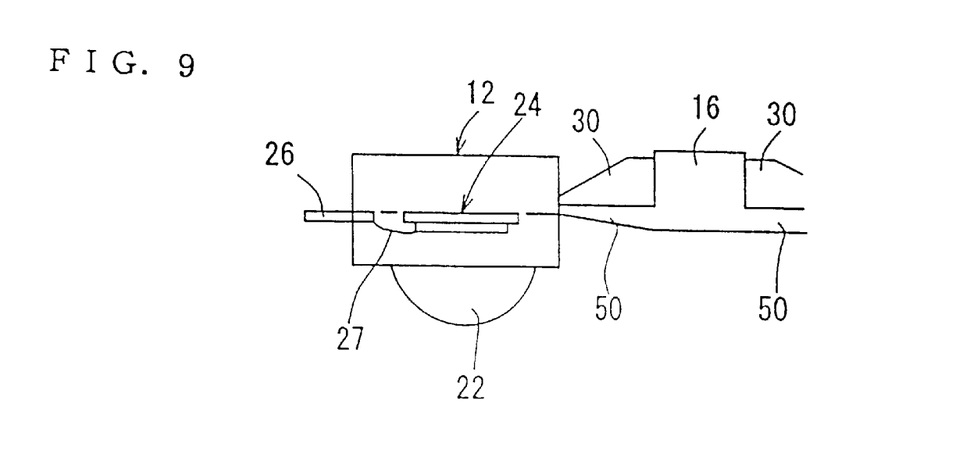
FIG. 9 is an enlarged cross-sectional view of yet another embodiment of the present invention.

In a similar manner, as shown in FIG. 9, it is also possible to utilize a similar construction for gate sides 30 as in FIG. 8, but to use a plate-like gate base 50 having a lower inclined surface on the inner wall of the base 50. In this embodiment, similar desired results as obtained are possible.

Figure 10:
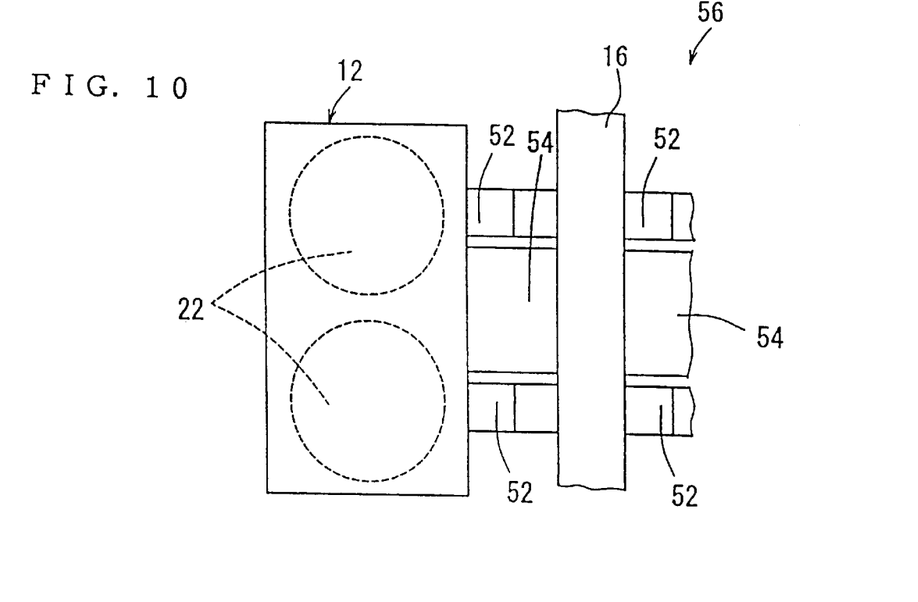
FIG. 10 is an enlarged plan view of still another embodiment of the present invention.

As shown in FIG. 10, molding device 56 can be constructed in such a manner that gate sides 52 and a plate-like gate base 54 are separated but disposed relatively close to each other in a side-by-side orientation. The mold resin injected from the gate side 52 is directed directly onto the lens parts in cavity 12, and the resin from plate-like gate base 54 is released instantly at the same time, resulting in a significant droppage in pressure. As a result, the mold resin spreads out in substantially four directions to fill cavity 12. This also results in no weld lines between the mold resin injected from the gate sides 52 primarily directed onto the lens parts and the other mold resin injected from the plate-like gate base 54 to the surrounding portions of cavity 12.

Figure 11:
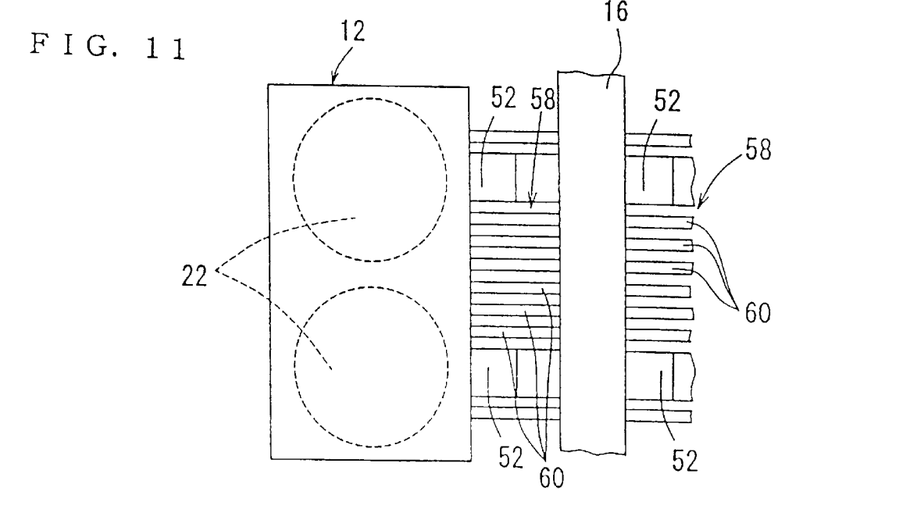
FIG. 11 is an enlarged plan view of a still further embodiment of the present invention.

Furthermore, it is also possible that the plate-like gate base 58 comprises a plurality of individual, spaced-apart gates 60, as shown in FIG. 11, used in combination with adjacent gate sides 52 which primarily direct resin onto the lens part. In this embodiment, the mold resin injected into the cavity 12 from the plurality of gates 60 is released from the relatively high pressure state to spread out in substantially four directions, and to then merge with the mold resin injected from the adjacent gate sides 52 and be fused to form a joined mold resin.

According to the molding device and the molding method of the present invention, a molding device comprises one or more gate sides for injecting mold resin into a cavity having one or more concave portions and one or more plate-like gate bases for injecting the mold resin into the other portion of the device's cavity. No failures, such as voids and weld lines, result when the mold resin is simultaneously injected under established pressures. Similarly, no cracks or other adverse features occur.

The molding device and the molding method according to the present invention have been described so far on the basis of the accompanying drawings, but the present invention is, however, not limited to the embodiments shown in these drawings. For example, although air release is achieved using an air gap between at least two adjacent (but spaced) lead pins (26, FIG. 3) sandwiched between the upper and lower parts, such release can be achieved using a shallow groove or the like formed in one or more of the walls of cavity 12.

Also, the runner of the molding device described herein can be of almost any shape provided it adequately supplies mold resin to the respective gate base(s) and side(s).

While there have been shown and described what are at present the preferred embodiments of the invention, it will be obvious to those skilled in the art that various changes and modifications may be made therein without departing from the scope of the invention as defined by the appended claims.

What is claimed is:

1. A molding device, comprising:
   a cavity having first and second parts, at least one of said parts including at lease one concave portion therein for molding an article having at least one convex portion therein; and a gate for injecting mold resin into said first and second parts of said cavity, said gate including at least one gate side portion for directing said mold resin into said part of said cavity having said at least one concave portion for molding a portion of said article having said at least one convex portion, and at least one plate-like gate base for injecting said mold resin in a substantially flat sheet state into said other part of said cavity for molding the other portions of said article.

2. The molding device according to claim 1, wherein said gate side includes an inwardly inclined inner surface to direct said mold resin into said at least one concave portion of said cavity.

3. The molding device according to claim 1, wherein both internal and external surfaces of said at least one gate side are inclined to direct the mold resin into said at least one concave portion of said cavity.

4. The molding device according to claim 1, wherein said at least one gate base and said at least one gate side are integrally formed.

5. The molding device according to claim 1 wherein said at least one gate base and said at least one gate side are spacedly positioned from one another.

6. The molding device according to claim 1 wherein said molding device includes a plurality of spacedly positioned gate bases oriented substantially parallel to one another.

7. The molding device according to claim 1, wherein said at least one plate-like gate base has a substantially upward inner surface relative to horizontal and said at least one gate side has a substantially downward inner surface relative to horizontal so as to direct said mold resin in at least two different directions into said cavity.

8. The molding device according to claim 1, wherein said at least one plate-like gate base includes two inner surfaces, both of which are inclined upwardly relative to horizontal so as to direct said mold resin in a direction substantially away from said concave portion of said cavity.

\* \* \* \* \*